(12) United States Patent
Dunn et al.

(10) Patent No.: US 12,717,387 B2
(45) Date of Patent: Aug. 25, 2026

(54) DISPLAY ASSEMBLIES WITH SUPPORT STRUCTURES FOR ELECTRONIC DISPLAY LAYERS

(71) Applicant: Manufacturing Resources International, Inc., Alpharetta, GA (US)

(72) Inventors: William Dunn, Alpharetta, GA (US); Mike Brown, Cumming, GA (US); Alex Moreau, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 19/293,908

(22) Filed: Aug. 7, 2025

(65) Prior Publication Data

US 2025/0362721 A1 Nov. 27, 2025

Related U.S. Application Data

(63) Continuation of application No. 19/188,502, filed on Apr. 24, 2025, now Pat. No. 12,405,641, which is a continuation of application No. 18/920,434, filed on Oct. 18, 2024, now Pat. No. 12,314,093, which is a continuation of application No. 18/609,896, filed on Mar. 19, 2024, now Pat. No. 12,153,479, which is a continuation of application No. 17/387,438, filed on Jul. 28, 2021, now Pat. No. 11,966,263.

(51) Int. Cl.
*G06F 1/20* (2006.01)
*G06F 1/18* (2006.01)
*G09F 9/33* (2006.01)
*H05K 7/20* (2006.01)

(52) U.S. Cl.
CPC ................ *G06F 1/181* (2013.01); *G06F 1/20* (2013.01); *G09F 9/33* (2013.01); *H05K 7/20972* (2013.01)

(58) Field of Classification Search
CPC .. G09F 9/33; G06F 1/181; G06F 1/20; H05K 7/20972
USPC .......................................................... 361/688
See application file for complete search history.

(56) References Cited

U.S. PATENT DOCUMENTS

| | | | | |
|---|---|---|---|---|
| 2011/0285923 | A1* | 11/2011 | Yokota | G02F 1/133608 348/739 |
| 2015/0261042 | A1* | 9/2015 | Sugaya | G02F 1/133603 362/97.3 |
| 2017/0172016 | A1* | 6/2017 | Kang | H05K 7/20972 |
| 2019/0146279 | A1* | 5/2019 | Tanikawa | G02F 1/133611 362/97.2 |
| 2022/0330443 | A1* | 10/2022 | Liu | H05K 5/0217 |
| 2023/0213805 | A1* | 7/2023 | Tong | G02F 1/133605 349/58 |

(Continued)

*Primary Examiner* — Christopher M Raabe
(74) *Attorney, Agent, or Firm* — Standley Law Group LLP; Jeffrey S. Standley; Adam J. Smith

(57) ABSTRACT

Display assemblies are disclosed which include a cover layer, an electronic display layer located behind the cover layer, an illumination device located rearward of, and spaced apart from, the electronic display layer, and support structures extending from a forward surface of the illumination device towards a rear surface of the electronic display layer. These support structures may be optically transmissible and support the electronic display layer, such as against rearward movement towards the illumination device.

18 Claims, 12 Drawing Sheets

(56) References Cited

U.S. PATENT DOCUMENTS

2025/0113468 A1 * 4/2025 Whitehead ................ G06F 1/20

* cited by examiner

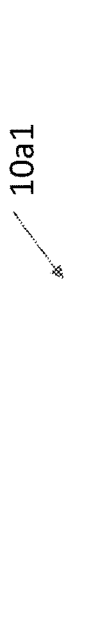
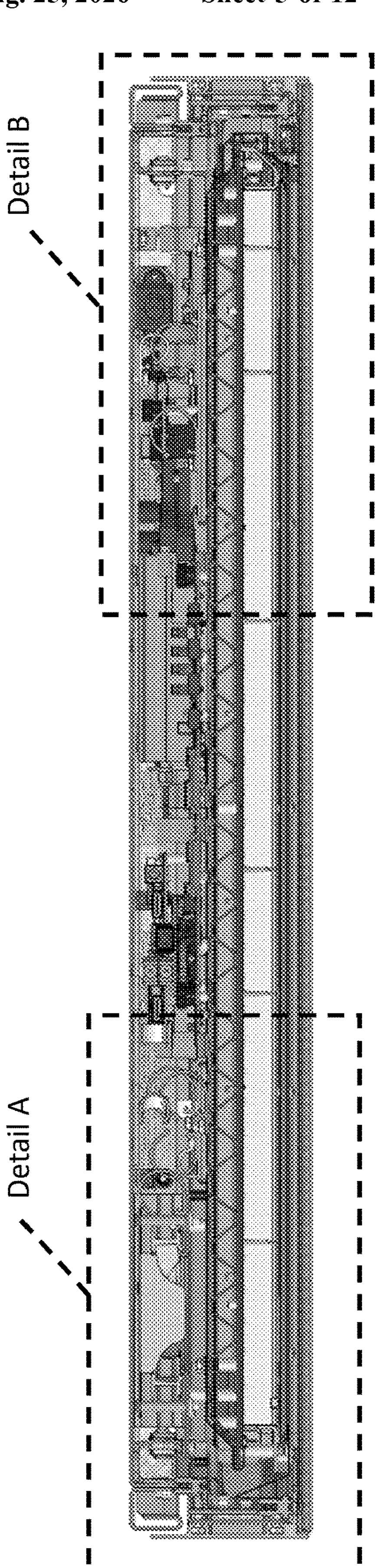
Figure 3A1

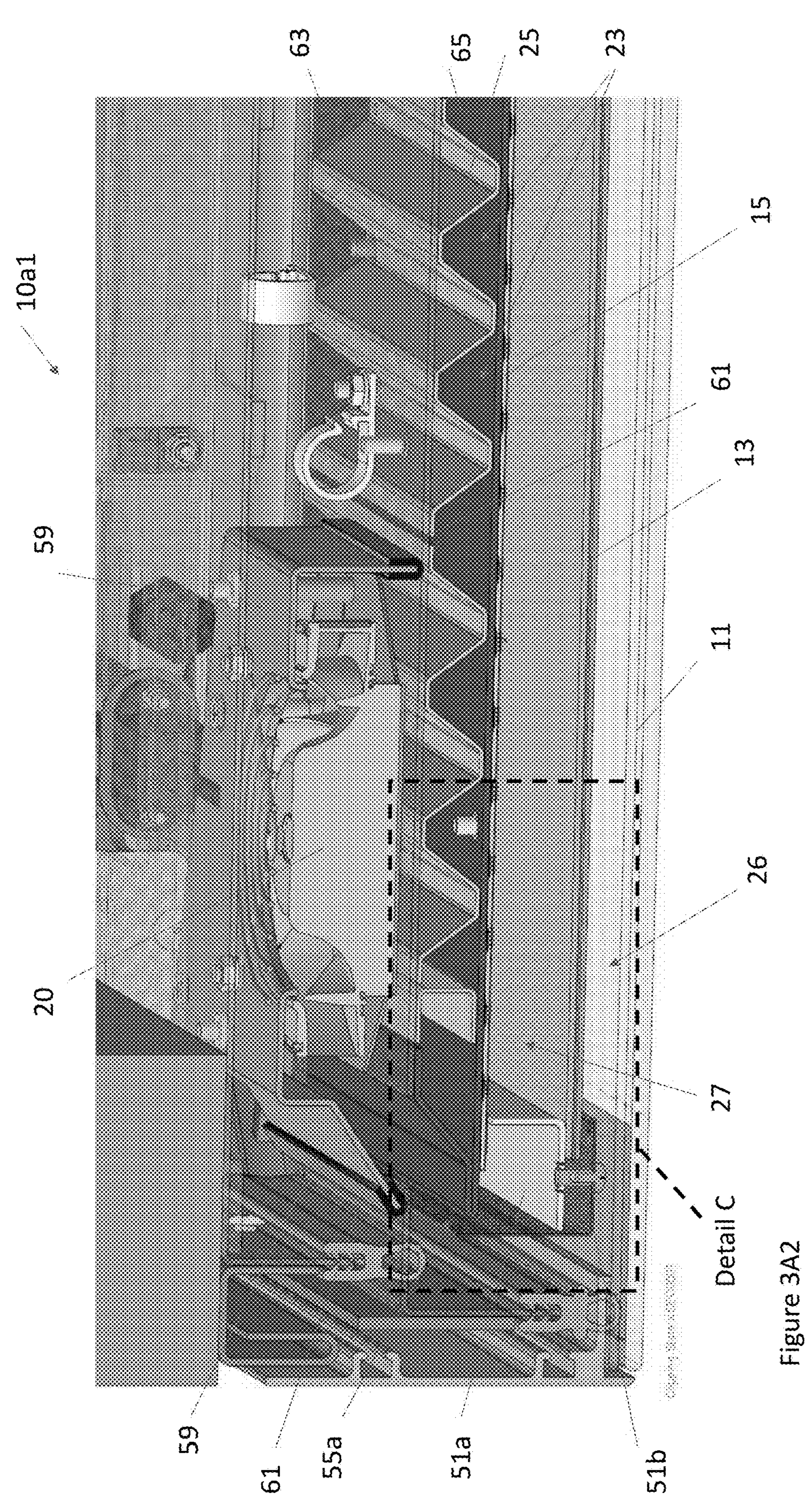
Figure 3A2

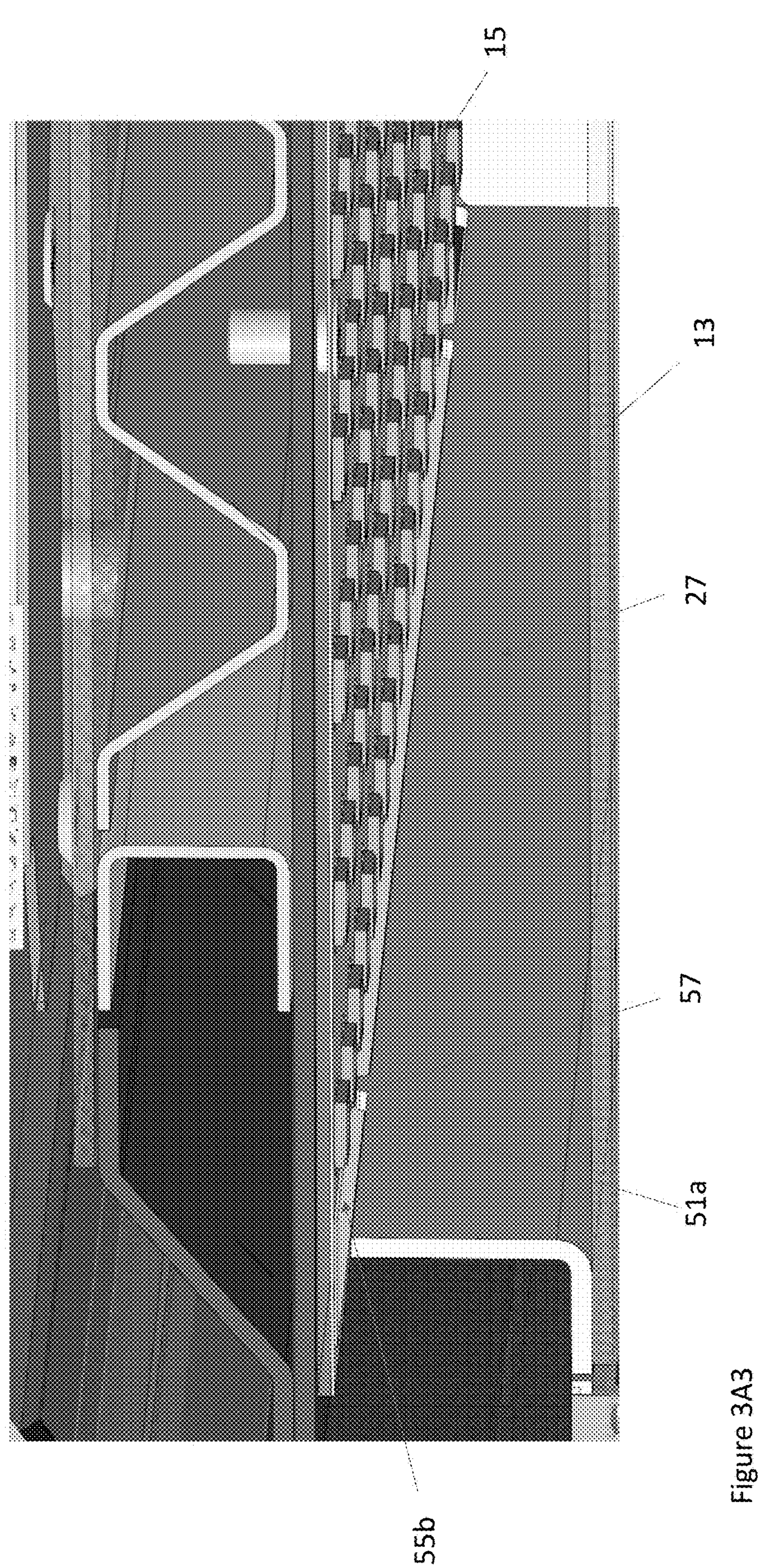
Figure 3A3

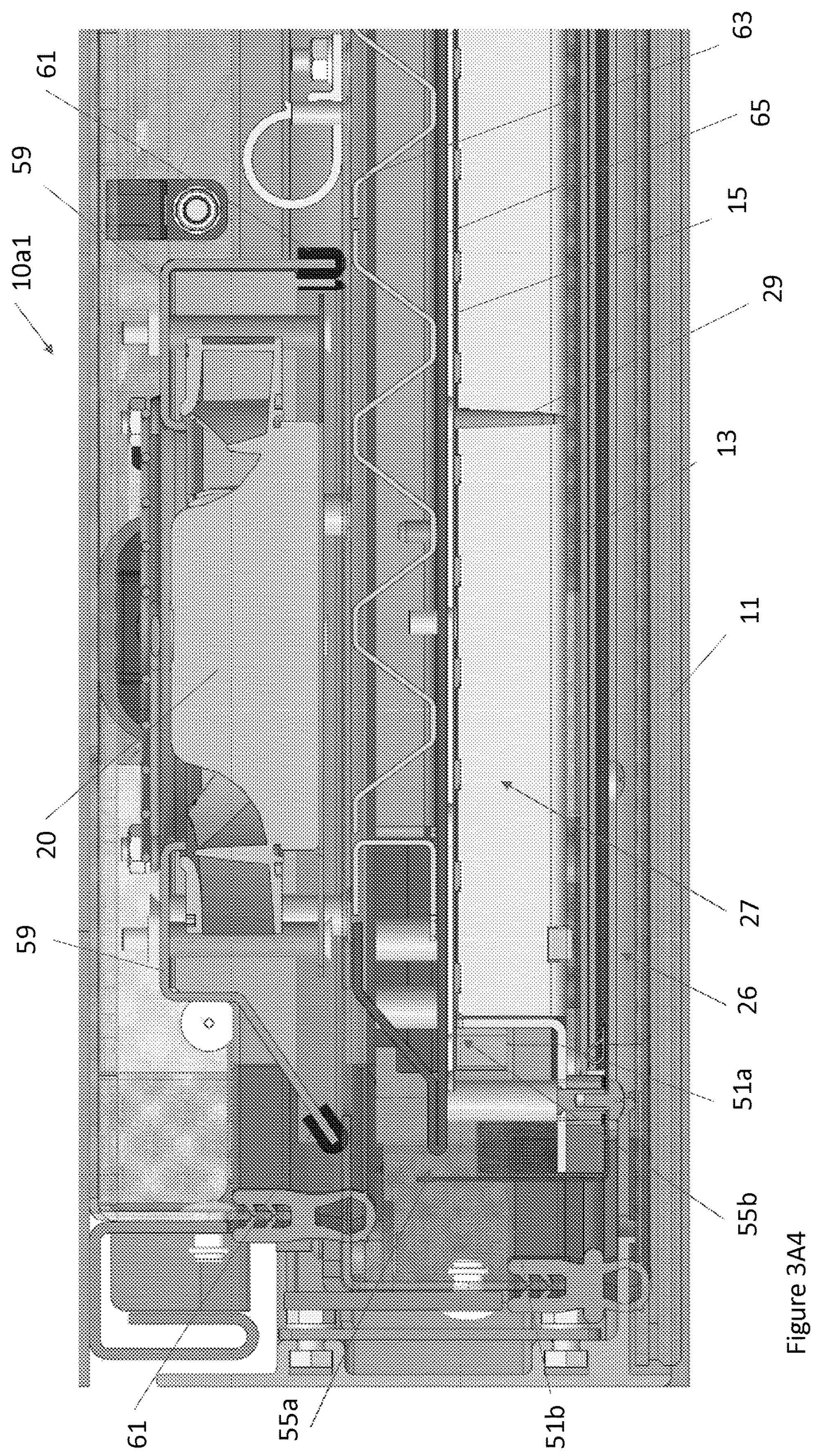
Figure 3A4

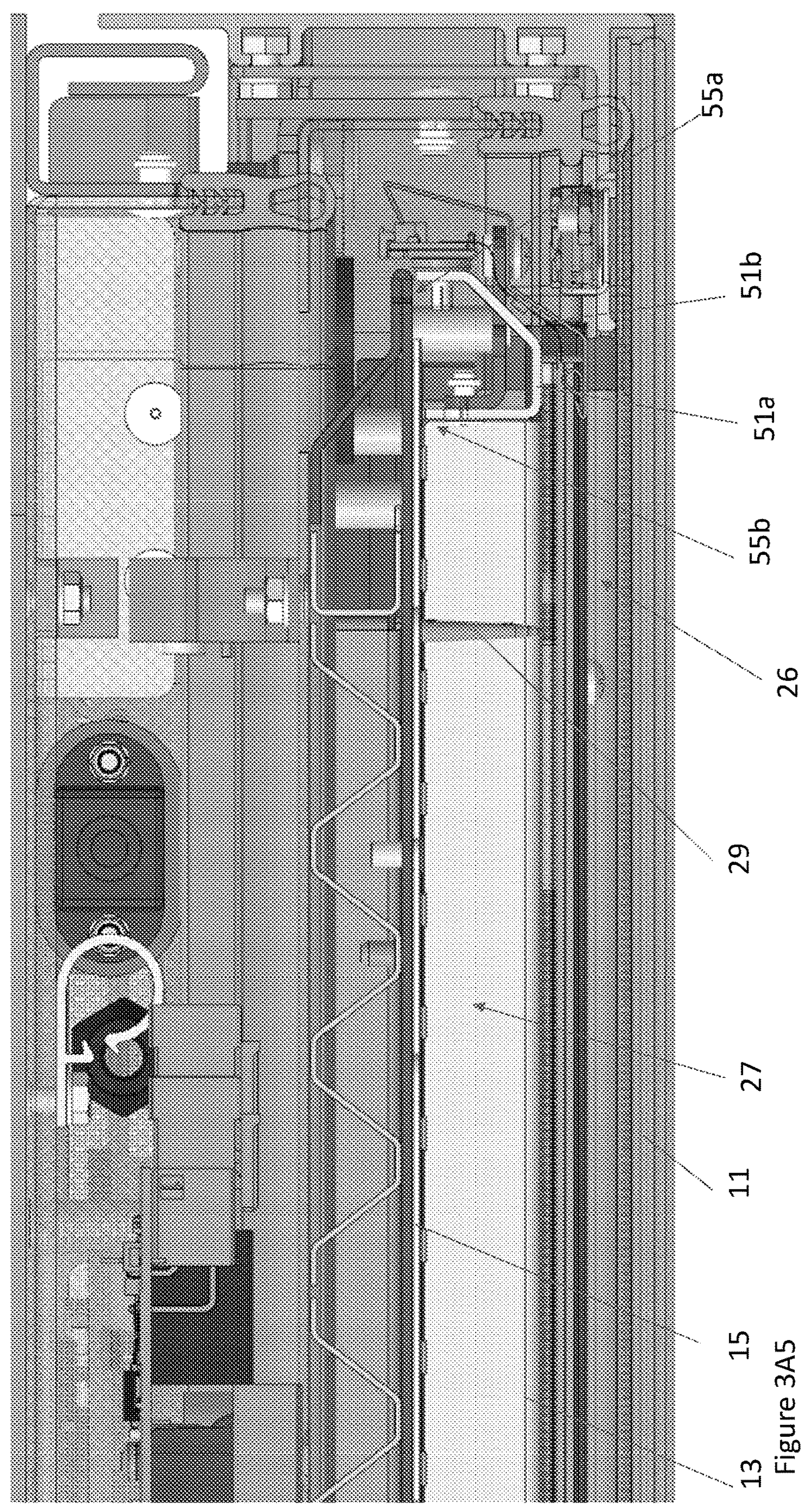
Figure 3A5

DISPLAY ASSEMBLIES WITH SUPPORT STRUCTURES FOR ELECTRONIC DISPLAY LAYERS

CROSS-REFERENCE TO RELATED APPLICATIONS

This application is a continuation of U.S. application Ser. No. 19/188,502 filed Apr. 24, 2025, which is a continuation of U.S. application Ser. No. 18/920,434 filed Oct. 18, 2024, now U.S. Pat. No. 12,314,093 issued May 27, 2025, which is a continuation of U.S. application Ser. No. 18/609,896 filed Mar. 19, 2024, now U.S. Pat. No. 12,153,479 issued Nov. 26, 2024, which is a continuation of U.S. application Ser. No. 17/387,438 filed Jul. 28, 2021, now U.S. Pat. No. 11,966,263 issued Apr. 23, 2024, the disclosures of which are incorporated by reference as if fully restated herein.

TECHNICAL FIELD

Exemplary embodiments relate generally to display assemblies with support structures, such as optical spikes, for supporting electronic display layers, such as from rearward movement towards a backlight.

BACKGROUND AND SUMMARY OF THE INVENTION

Certain electronic display layers, such as those comprising liquid crystals, are relatively thin. These electronic display layers often span a relatively large area. In some cases, these electronic display layers may only be supported at a perimeter. This may subject the electronic display layers to distortion by external forces, such as air pressure. Such distortions may result in various optical or other performance issues. These issues become particularly problematic when relatively large displays are utilized because relatively small air pressures experienced over a large area result in application of significant net forces. It is known to provide air on either side of an electronic display layer to create a pressure differential which reduces or eliminates bowing of the electronic display layer, such as is shown and/or described in U.S. Pat. No. 10,398,066 issued Aug. 27, 2019.

It is known to provide various optical layers at the electronics display layer and/or a cover for the same including, but not limited to, polarizing films, anti-reflective coatings, combinations thereof, or the like to improve optical qualities of displayed images. In certain cases, it may be desirable to provide compressive forces on one or both sides of an electronic display layer to prevent or eliminate cell breach of the electronic display layer and/or mechanical separation of optical layers. What is needed is a display assembly which provides compressive forces on one or both sides of an electronic display layer.

Display assemblies which provide compressive forces on one or both sides of an electronic display layer, and methods related to the same, are provided. The display assemblies may include one or more closed loop airflow pathways. At least one of the closed loop airflow pathways may include a front passageway which extends between a cover for the electronic display layer and the electronic display layer itself as well as an illumination device passageway which extends between the electronic display layer and an illumination device for the electronic display layer. A rear passageway extending behind the illumination device may be in fluid communication with both the front passageway and the illumination device passageway to complete the closed loop airflow pathway, which may encircle the illumination device and/or the electronic display layer.

A closed loop fan unit may be positioned adjacent to an entrance to the front passageway and the illumination device passageway in exemplary embodiments. The closed loop fan unit may be configured to push circulating gas through the front passageway and illumination device passageway when activated. The closed loop fan unit may be configured to generate a relatively high-pressure area at a first side of the closed loop fan unit facing the entrance to the front passageway and illumination device passageway such that such a relatively high-pressure flow is created within at least a portion of the front passageway and illumination device passageway when activated. The closed loop fan unit may be configured to generate a relatively low-pressure area at an opposing side of the closed loop fan unit facing the rear passageway when activated such that a relatively low-pressure flow is created within the rear passageway when activated. When operated, the closed loop fan unit may be configured to generate a pressure differential on one or both sides of the electronic display layer such that a pressure of a flow of the circulating gas in the front passageway is higher than a pressure of a flow of the circulating gas in the illumination device passageway. This may result in inward directed net forces at the electronic display layer which forces the electronic display layer rearward towards the illumination device, thereby reducing or eliminating bowing of the electronic display layer. This arrangement may be configured to create a positive pressure relative to ambient at one or both of a front and/or rear surface of the electronic display layer (e.g., in the front passageway and/or the illumination device passageway) so as to provide compressive forces at the front and/or rear side of the electronic display layer. This may prevent cell breach in the electronic display layer and/or mechanical separation of the optical layers from either or both of the electronic display layer and the cover. Optical spikes may be provided between the electronic display layer and the illumination device, such as within the illumination device passageway, to limit or prevent rearward movement of the electronic display layer towards the illumination device to prevent visual distortions.

In other exemplary embodiments, the closed loop fan unit may be positioned at an exit of the front passageway and illumination device passageway. The closed loop fan unit, in such embodiments, may be configured to draw circulating gas through the front passageway and the illumination device passageway. The closed loop fan unit, in such embodiments, may be configured to generate a relatively low-pressure area at the exit to the front passageway and the illumination device passageway and/or a relatively high-pressure area at an opposing side of the closed loop fan unit oriented towards the rear passageway when activated. In such embodiments, the closed loop fan unit may be configured to create a negative pressure relative to ambient within some or all of the front passageway and/or illumination device passageway such that a pressure of a flow of the circulating gas in the front passageway is higher than a pressure of a flow of the circulating gas in the illumination device passageway, even if one or both are negative relative to pressure of ambient air. Such an arrangement may permit creation of differential pressures sufficient to reduce or eliminate bowing of the electronic display layer.

The display assemblies may include multiple electronic display layers in exemplary embodiments. Where multiple electronic display layers are utilized, a single rear passageway may be common to at least two of the multiple electronic display layers. The display assemblies may include one or more open loop airflow pathways for ambient air. One or more open loop fan units may be provided for forcing ambient air through the open loop airflow pathways when operated. A structural framework may be used to secure and/or house the various components of the display assemblies. The closed loop fan units may be mounted within the rear passageways, in exemplary embodiments. Electronic components for operating the electronic display layers may be provided within the rear passageway.

Pressure sensors may be provided to monitor the differential pressure created, pressures of circulating gas within one or both of the front passageway and illumination device passageway and/or pressures of ambient air. Such sensors may be in electronic communication with one or more controllers. Operation of the closed loop fan units and/or open loop fan units may be adjusted, such as by the controllers, in response to readings from the sensors. For example, speed or duration of operation of the closed loop fan units may be adjusted to maintain the desired pressure differential and/or positive pressure relative to ambient within one or both of the front passageway and/or illumination device passageway.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 3A1 is a top sectional view of the display assembly of FIG. 3A;

FIG. 3A2 is a detailed perspective view of detail A of FIG. 3A1;

FIG. 3A3 is a detailed perspective view of detail C of FIG. 3A2;

FIG. 3A4 is a detailed top sectional view of detail A of FIG. 3A1;

FIG. 3A5 is a detailed top sectional view of detail B of FIG. 3A1;

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
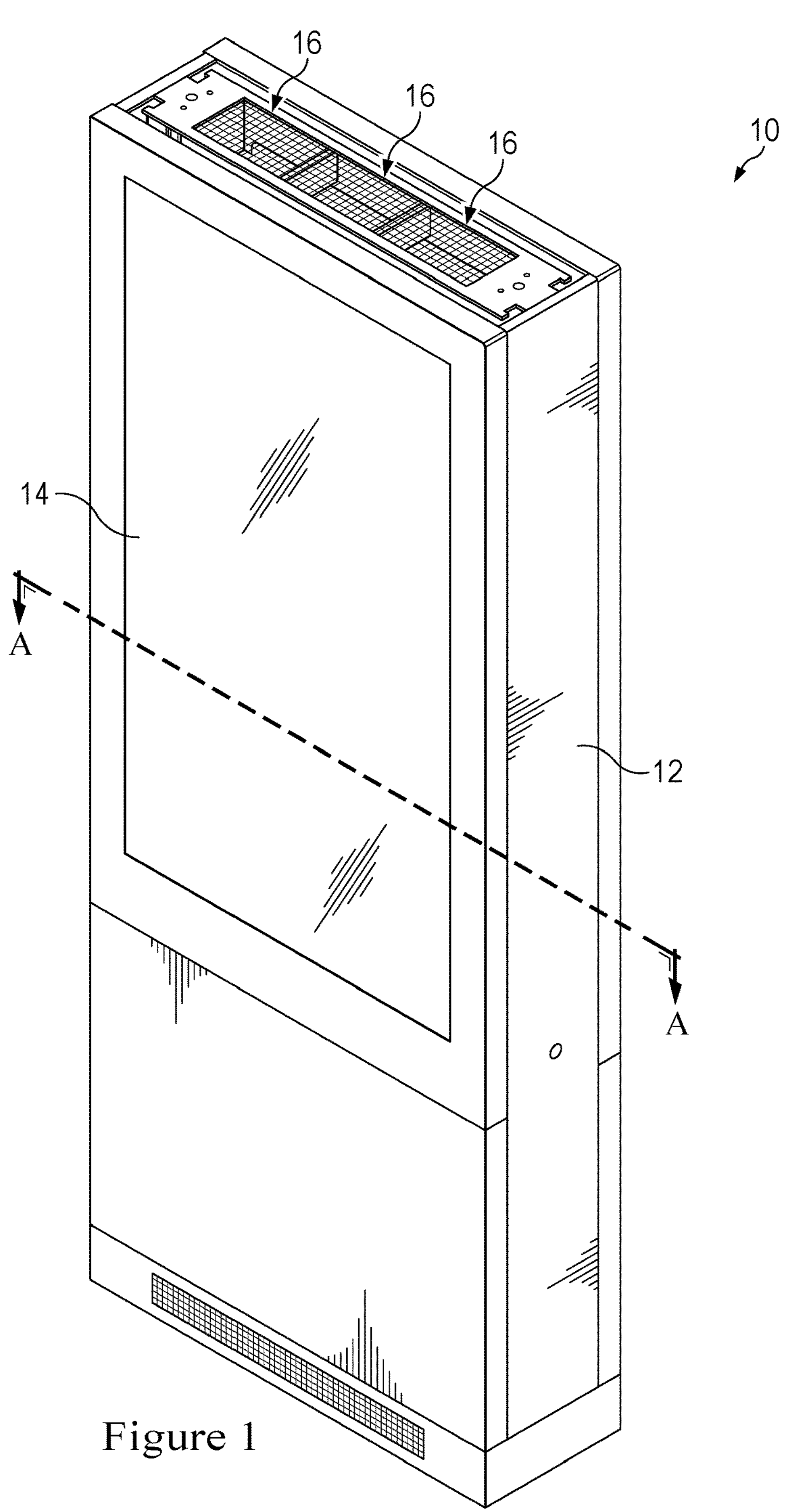
FIG. 1 is a perspective view of an exemplary display assembly indicating section lines A-A.
Figure 2A:
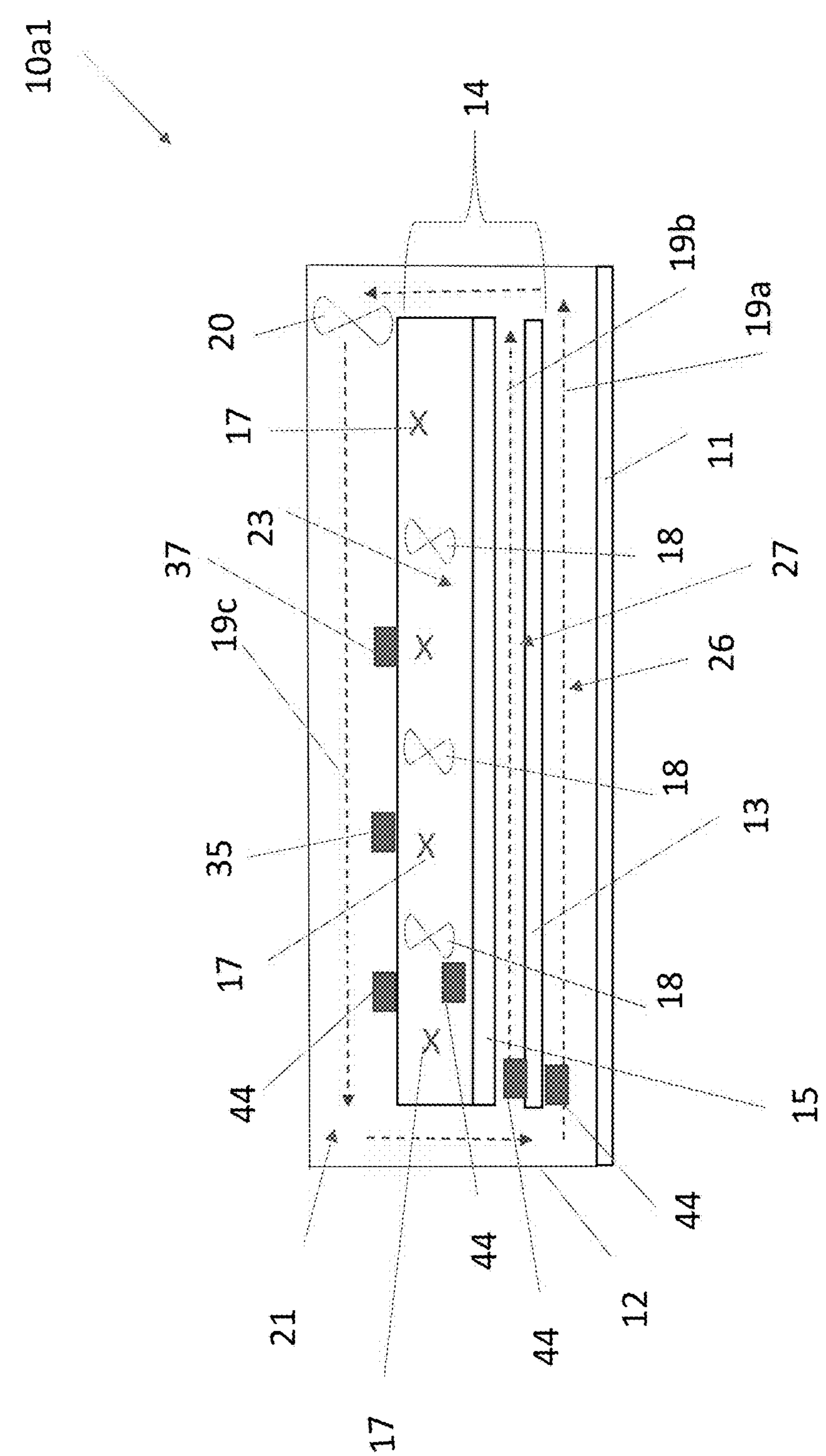
FIG. 2A is a top sectional view of an exemplary embodiment of the display assembly of FIG. 1 taken along section line A-A.
Figure 2B:
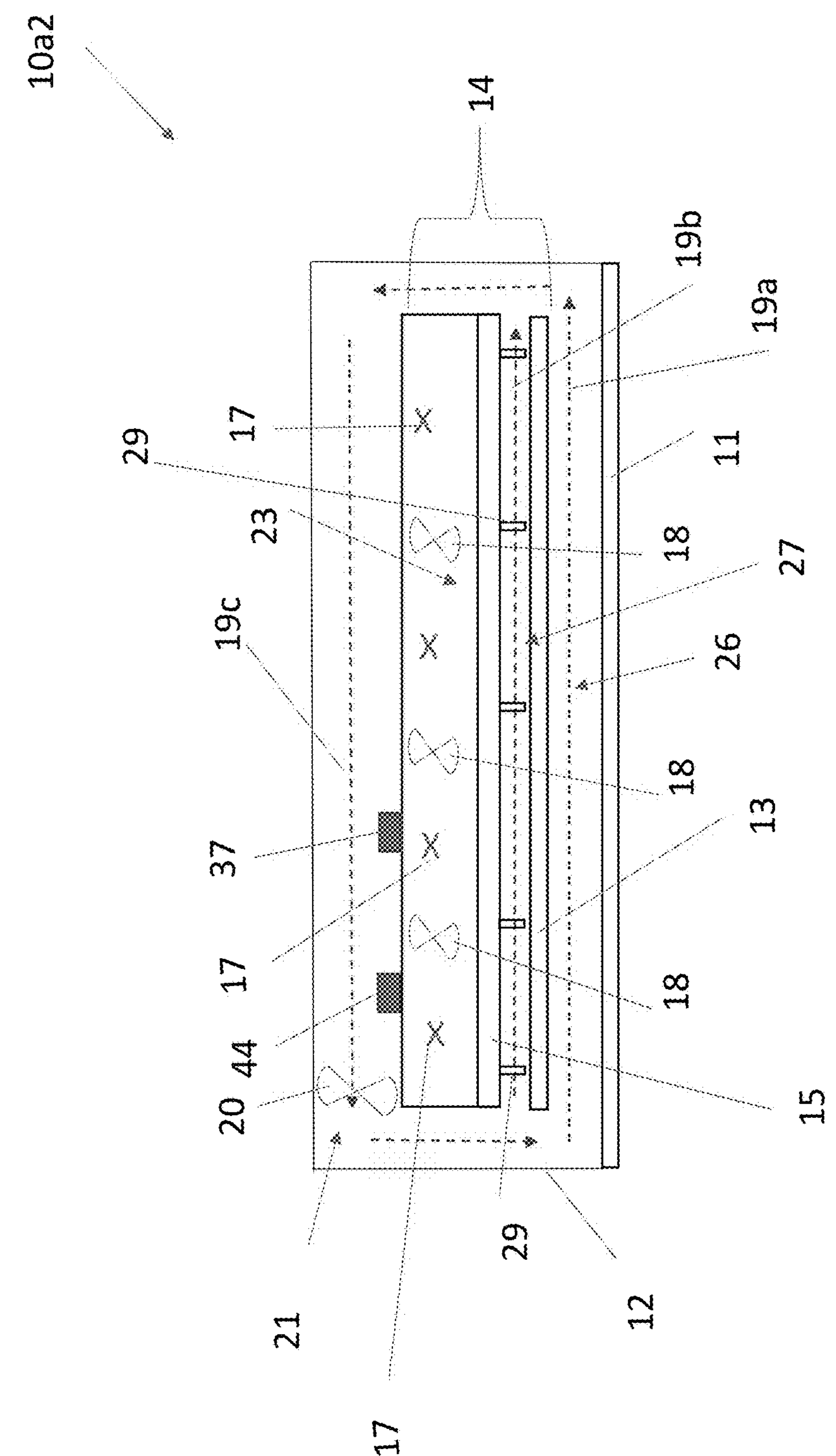
FIG. 2B is a top sectional view of another exemplary embodiment of the display assembly of FIG. 1 taken along section line A-A.

FIG. 1 is a perspective view of an exemplary electronic display assembly (hereinafter also a "unit") 10 in accordance with the present invention. The unit 10 may include a structural framework 12. The structural framework 12 may be configured for mounting to a ground surface, such as a sidewalk or street, mounting to a wall or other surface, incorporation into street furniture (e.g., phone booths, bus shelters, benches, railings, combinations thereof, or the like), combinations thereof, or the like. The structural framework 12 may comprise one or more members, panels, cladding, panels, housings, combinations thereof, or the like.

The units 10 may comprise one or more electronic display subassemblies 14. Some or all of the electronic display subassemblies 14 may be attached to the structural framework 12 in a moveable manner, though such is not required. For example, the electronic display subassemblies 14 may be attached to the structural framework in a hinged manner to permit selective movement between a closed position whereby certain parts of the units 10 are fully or partially sealed, and an open position whereby certain parts of the interior of the unit 10 are exposed for access.

One or more intakes and exhausts 16 may be provided at the units 10 for ingesting and exhausting ambient air.

Figure 3A:
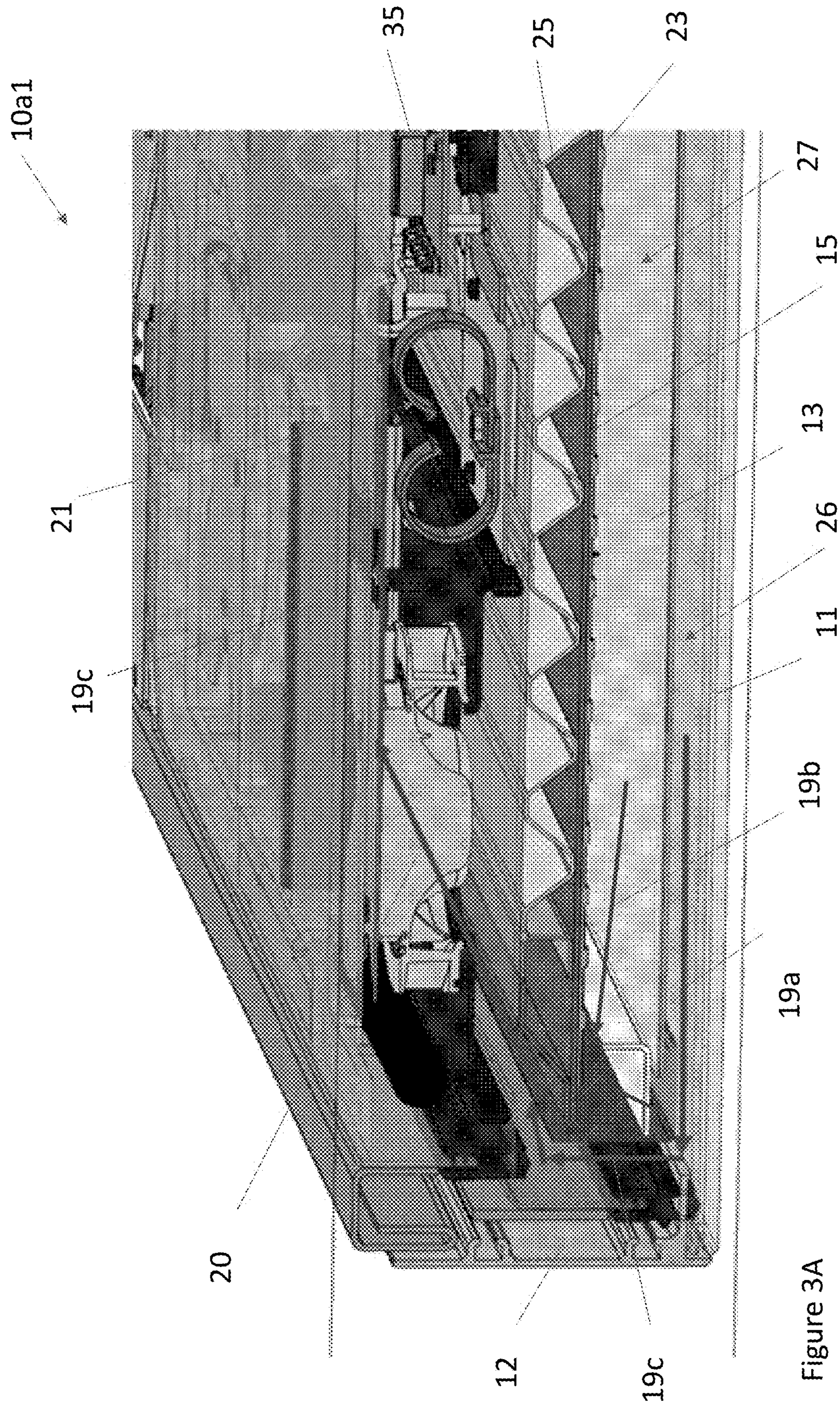
FIG. 3A is a perspective sectional view of an exemplary embodiment of the display assembly of FIG. 1 taken along section line A-A.
Figure 3B:
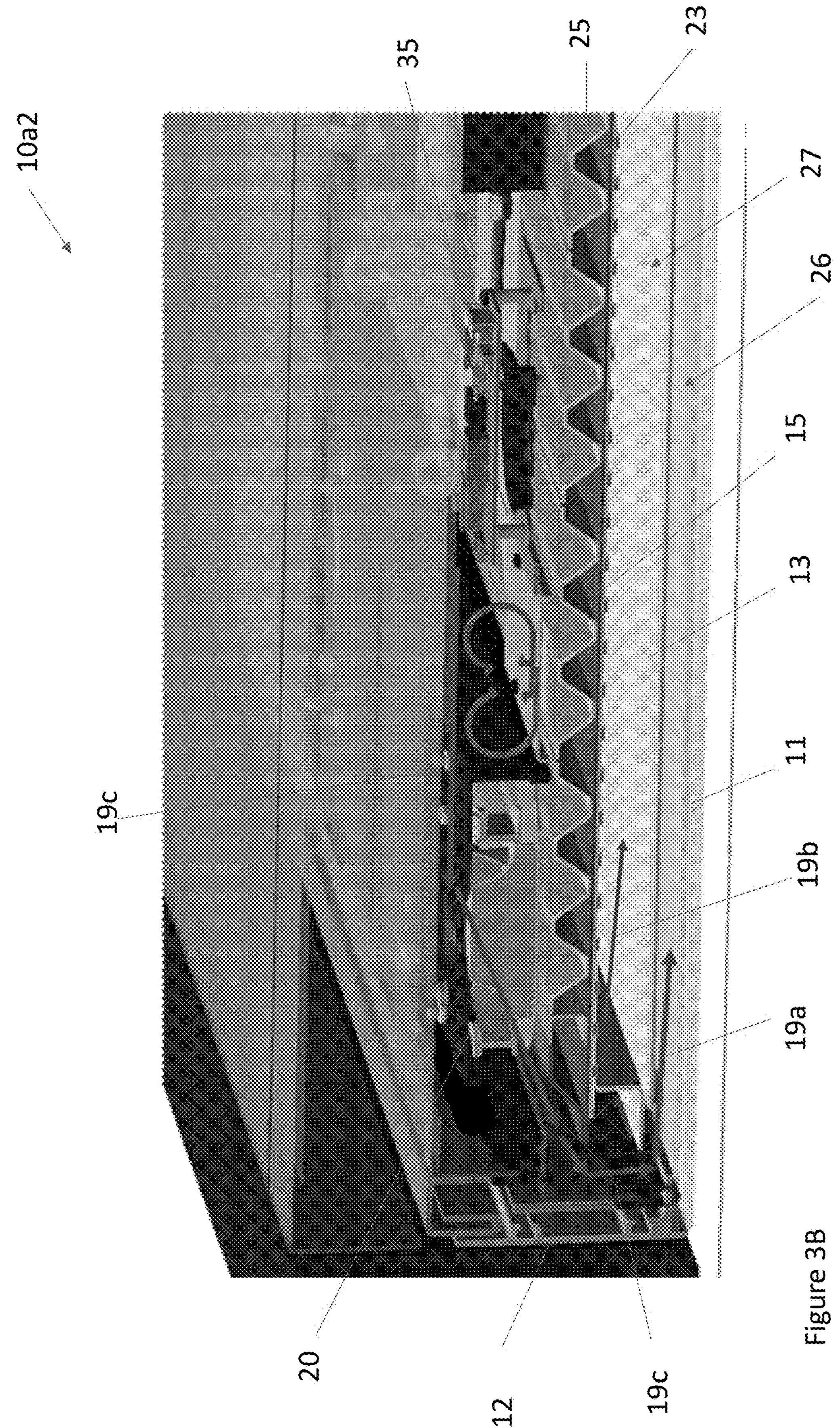
FIG. 3B is a perspective sectional view of another exemplary embodiment of the display assembly of FIG. 1 taken along section line A-A.
Figure 4A:
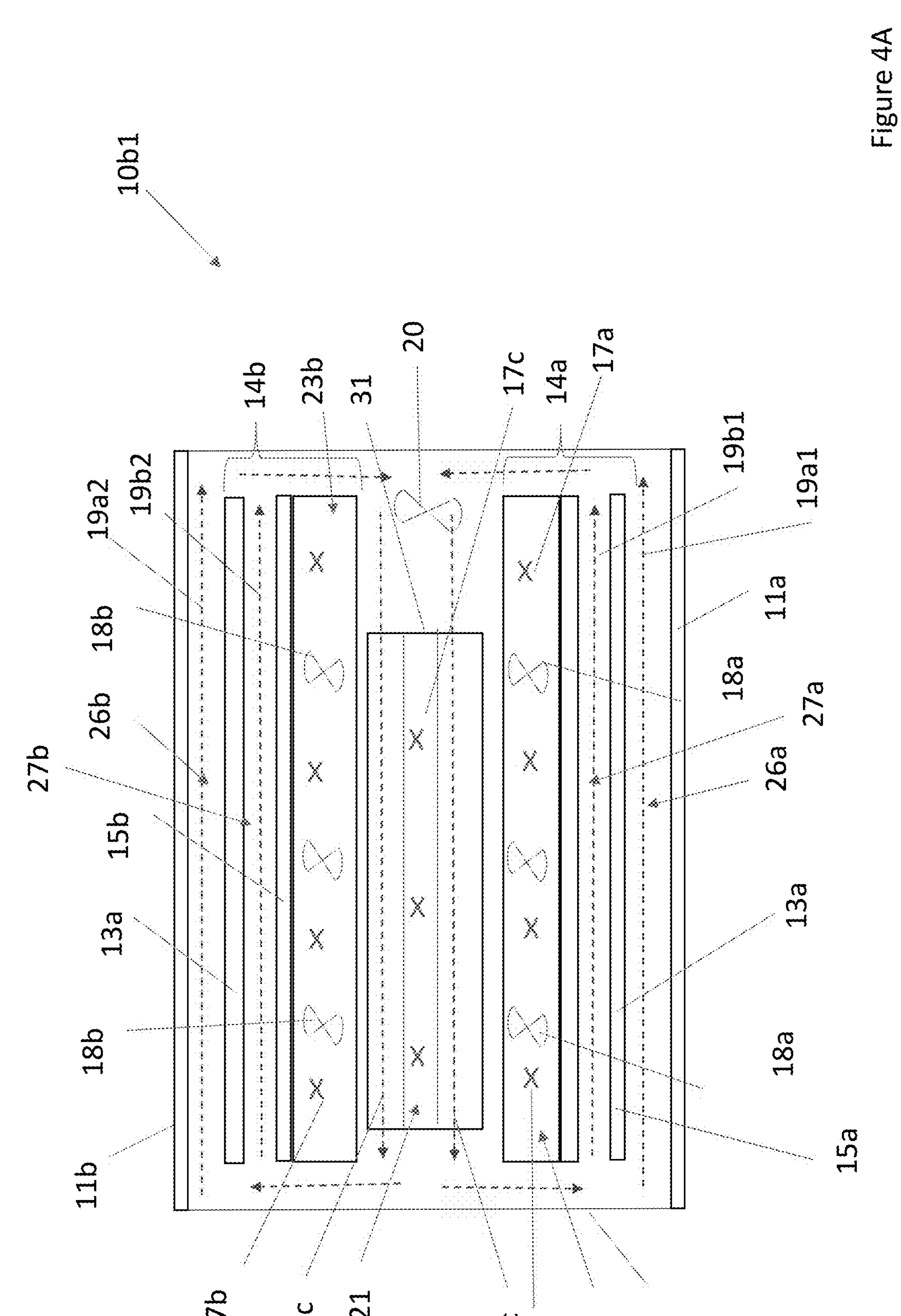
FIG. 4A is a top sectional view of the display assembly of another exemplary embodiment of the display assembly of FIG. 1 taken along section line A-A.
Figure 4B:
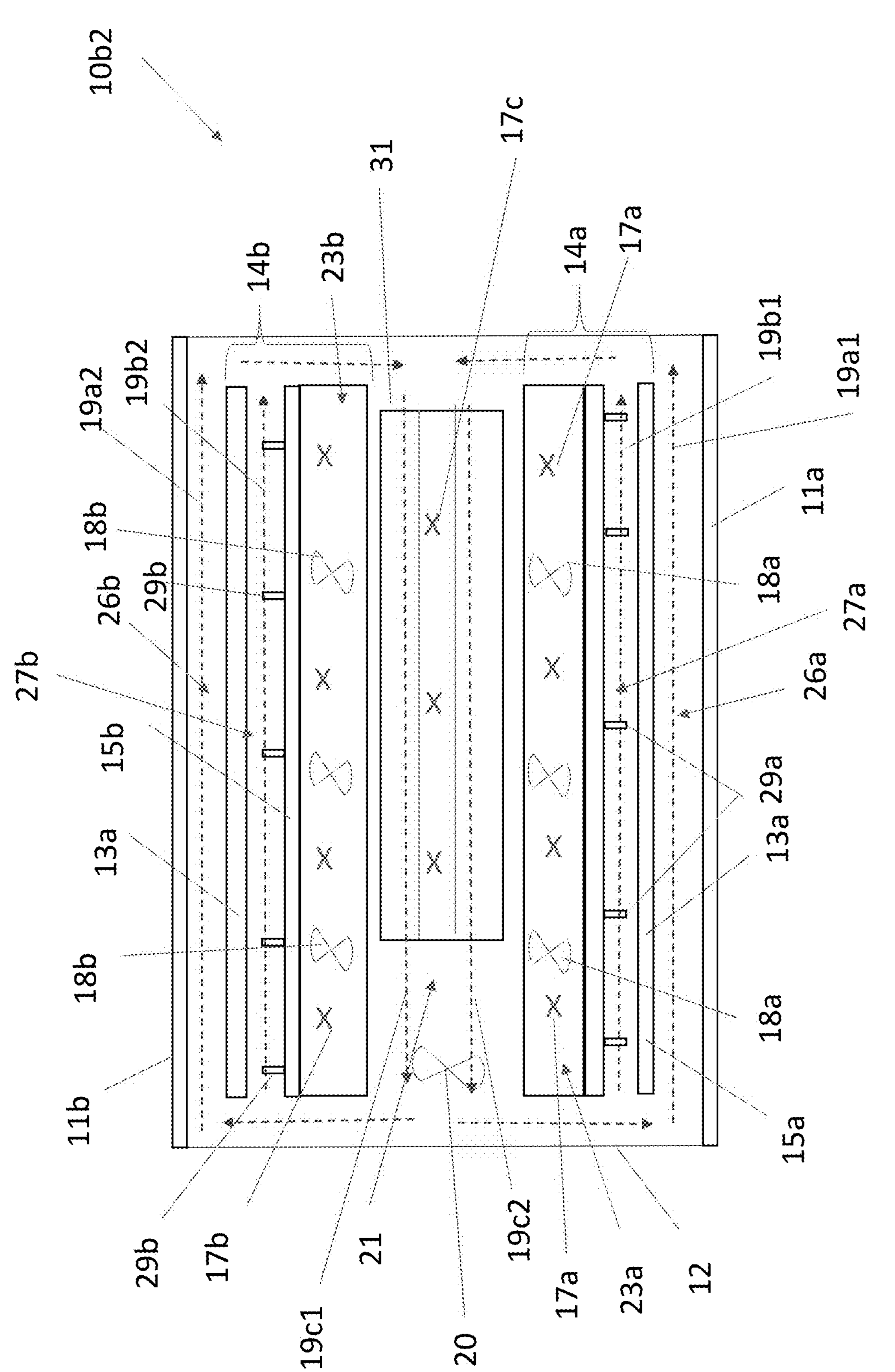
FIG. 4B is a top sectional view of the display assembly of another exemplary embodiment of the display assembly of FIG. 1 taken along section line A-A.

FIG. 2A through FIG. 4B illustrate various exemplary embodiments of airflow pathways within the units 10. FIGS. 2A-3B illustrate exemplary units 10*a*1, 10*a*2 with a single electronic display subassembly 14. FIGS. 4A-4B illustrate exemplary units 10*b*1, 10*b*2 with two electronic display subassemblies 14*a*, 14*b* placed in a back-to-back arrangement. Any number of electronic display subassemblies 14 may be utilized in any arrangement with the structural framework 12. Similar or the same components used in conjunction with units 10 having multiple electronic display subassemblies 14 may use the same numbering with the addition of an "a", "b" and/or "1", "2", etc. (e.g., 14 to 14*a*, 14*b*, 19*a* to 19*a*1, 19*a*2). Any features or arrangements shown and/or described with respect to any of the embodiments of the units 10*a*1, 10*a*2, 10*b*1, 10*b*2 (sometimes referred to collectively as "unit 10" or "units 10" herein) may be used with any other embodiment of the units 10.

Each electronic display subassembly 14 may comprise an illumination device 15. In exemplary embodiments, the illumination device 15 may comprise a number of lighting elements, such as LEDs, provided at a substrate, such as a printed circuit board. Each electronic display subassembly 14 may comprise an electronic display layer 13. The electronic display layer 13 may comprise a layer of liquid crystals, such as for a liquid crystal display, though any type or kind of electronic display may be utilized. In exemplary embodiments, the illumination device 15 may be provided rearward of the electronic display layer 13 to serve as a direct backlight. In other exemplary embodiments, the illumination device 15 may comprise one or more diffusive and/or transmissive layers and the substrate and/or lighting elements may be positioned about the edge of the electronic display layer 13 to provide edge lighting to the same.

The electronic display layer 13 and/or illumination device 15 may be positioned rearward of a cover 11. The cover 11 may comprise one or more layers of a transparent or translucent material(s). In exemplary embodiments, each cover 11 may comprise two layers bonded with an optically clear adhesive, which may provide increased impact protection. One or more polarizers, anti-reflective materials, combinations thereof, or the like may be disposed on some or all of the cover 11 as a coating, film, layer, combinations thereof, or the like. The cover 11 may form part of the electronic display subassembly 14 or may be separate therefrom. The cover 11 and the structural framework 12 may together substantially enclose the units 10, such as with intakes/exhausts 16 exempted, when the subassemblies 14 are placed in a closed position. The cover 11 may be configured to move with the electronic display subassembly 14, may be configured for independent movement, and/or may be fixed to the structural framework 12. Each of the electronic display subassemblies 14 may be connected to the structural framework 12 in a hinged or otherwise movable manner, though such is not required.

A single or multiple such electronic display subassemblies 14 may be provided at a single unit 10, such as, but not limited to, in a back-to-back arrangement. The electronic display subassemblies 14 may be of the same or different type and may comprise the same or different components. The electronic display subassemblies 14 may be provided in any arrangement such as portrait or landscape.

The intakes and/or exhausts 16 may be fluidly connected to one or more open loop airflow pathways 23 within the units 10. A respective one of the open loop airflow pathways 23*a*, 23*b* may extend through a respective one of the electronic display subassemblies 14*a*, 14*b* in exemplary embodiments such that an open loop airflow pathway 34 is provided for each one of the electronic display subassemblies 14, which may be entirely separate, or separated for a distance and rejoined. For example, without limitation, the open loop airflow pathways 23 may extend behind and along at least a portion of the illumination devices 15 for the electronic display layer 13 for accepting flows 17*a*, 17*b* of ambient air. The open loop airflow pathways 23 may comprise one or more corrugated layers 25 in exemplary embodiments.

One or more closed loop airflow pathways may be provided within the units 10. In exemplary embodiments, such closed loop airflow pathways may comprise at least a front passageway 26, which may extend between the cover 11 and the electronic display layer 13. Such closed loop airflow pathways may comprise a rear passageway 21, which may extend behind the electronic display subassembly 14, and/or behind the electronic display layer 13. Such closed loop airflow pathways may extend entirely within the unit 10, such as within outer boundaries of the structural framework 12. Where multiple electronic display subassemblies 14*a*, 14*b* are utilized, the rear passageway 21 may be common to at least two of the electronic display subassemblies 14*a*, 14*b*, though such is not required. A heat exchanger 31 may be located within the rear passageway 21, though such is not required. The heat exchanger 31 may comprise a multilayer heat exchanger configured to accommodate a common flow 19*c* of the circulating gas through at least some of the layers as well as one or more flows 17*c* of ambient air through at least some other ones of the layers.

Various electronic components 35 for operating the unit 10 may be provided within the rear passageway 21. The electronic components 35 may include, for example, without limitation, video players, power supplies, processors, electronic storage devices, controllers 37, sensors 44, combinations thereof, or the like. Any number, type, and/or kind of components 35 may be utilized.

An illumination device passageway 27*a*, 27*b* may extend between each of the electronic display layers 13*a*, 13*b* and the respective illumination devices 15*a*, 15*b*. A flow of circulating gas 19*c* within the rear passageway 21 may be separated such that a first portion 19*a* flows through the front passageway 26 and a second portion 19*b* flows through the illumination device passageway 27. The flows 19*a*, 19*b* may be recombined, such as in the rear passageway 21.

One or more open loop fan units 18 may be provided. The same of different open loop fan units 18 may be associated with each of the open loop airflow pathways 23. The open loop fan units 18 may be configured to ingest ambient air 17 into the units 10, exhaust ambient air 17 from the assembly 10, and/or move ingested ambient air 17 through the one or more open loop airflow pathways 23 when activated. Multiple open loop fan units 18*a*, 18*b* may be used where multiple electronic display subassemblies 14*a*, 14*b* are utilized, for example, or such open loop fan units 18 may be common to multiple ones of the electronic display subassemblies 14 of such units 10.

One or more closed loop fan units 20 may be provided. Each closed loop fan unit 20 may comprise one or more fans or the same of different type. The same or different closed loop fan units 20 may be associated with each of the closed loop airflow pathways. The closed loop fan units 20 may be configured to move circulating gas through said one or more closed loop airflow pathways when activated. The closed and open loop fan units 20, 18 may comprise axial fans, centrifugal fans, combinations thereof, or the like. Any number or type of fan units 20, 18 may be used at any location in the units 10, and may be provided in banks or sets. The open loop airflow pathways 23 may be separate from the closed loop airflow pathways, though a complete (e.g., gas impermeable) separation is not necessarily required. The same closed loop fan units 20 may be used to move circulating gas through the front passageways 26*a*, 26*b* and/or illumination device passageways 27*a*, 27*b* of multiple electronic display subassemblies 14*a*, 14*b* where such multiple electronic display subassemblies 14*a*, 14*b* are provided for a unit 10, though such is not required.

The unit 10 may comprise a controller 37 and/or one or more sensors 44. The sensors 44 may comprise, for example, without limitation, temperature sensors, fan speed sensors, airflow sensors, humidity sensors, relative humidity sensors, air pressure sensors, differential pressure sensors, location sensors, moisture sensors, combinations thereof, or the like. Any type, kind, or number of sensors 44 may be utilized at any number of locations within the units 10. In exemplary embodiments, at least certain of the sensors 44 may comprise tubes or other fluid passageways to connect the sensor (s) 44 to other parts of the units 10 and/or the ambient environment. This may provide for flexibility in placement and design. Any type, kind, or number of controllers 31 may be utilized at any number of locations within the units 10. Such sensors 44 and/or controller 37 are not necessarily required, and may be omitted from view of certain embodiments provided herein to more clearly illustrate other components. However, such sensors 44 and/or controller 37 may be utilized in the same or similar arrangements in such embodiments, even where not expressly provided in the figures.

The one or more closed loop fan units 20 may be configured to create a pressure differential. For example, an intake side of each closed loop fan unit 20 may be configured to generate a relatively low-pressure area or flow and an exhaust side may be configured to generate a relatively high-pressure area or flow. As illustrated with particular regard to FIGS. 2A, 3A-3A5, and 4A, in exemplary embodiments, one or more of the closed loop fan units 20 may be positioned adjacent to an exhaust for the front passageway 26 and/or the illumination device passageway 27. For example, without limitation, the closed loop fan units 20 in such embodiments may be positioned at a portion of the rear passageway 21 adjacent to an exit from one or both of the front passageway 26 and the illumination device passageway 27 for generating the flows 19*a* and/or 19*b* within the front passageway 26 and the illumination device passageway 27 by pulling the circulating gas into an intake side of the closed loop fan unit 20, and generating the flow 19*c* within the rear passageway 21 by pushing the circulating gas out an exhaust side of the closed loop fan unit 20. Because the intake, relatively low-pressure side, of the closed loop fan units 20 is fluidly adjacent to the front passageway 26 and/or the illumination device passageway 27, the pressure of the flows 19*a* and/or 19*b*, particularly near the exit of the front passageway 26 and/or the illumination device passageway 27, may be maintained at a relatively low level, such as negative relative to pressure of ambient air outside of the units 10, though such is not necessarily required.

Alternatively, without limitation, the one or more of the closed loop fan units 20 may be positioned at a portion of the rear passageway 21 adjacent to an entrance into one or both of the front passageway 26 and the illumination device passageway 27 for generating the flows 19*a* and/or 19*b* through the front passageway 26 and the illumination device passageway 27 by pushing the circulating gas through the front passageway 26 and the illumination device passageway 27. Because the exhaust, relatively high-pressure side of the closed loop fan units 20 is fluidly adjacent to the front passageway 26 and/or the illumination device passageway 27, the pressure of the flows 19*a* and/or 19*b*, particularly at the entrances to the front passageway 26 and the illumination device passageway 27, may be maintained at a relatively high level, such as greater than pressure of ambient air outside of the units 10, though such is not necessarily required.

The front passageway 26 and/or the rear passageway 21 may be configured to create and maintain a pressure differential between the flows 19*a* and 19*b* of the circulating gas in the front passageway 26 and/or the rear passageway 21 sufficient to generate net forces at the electronic display layers 13 which reduces or eliminates bowing of the electronic display layers 13. In exemplary embodiments, the pressure of the flow 19*a* in the front passageway 26 may be maintained at a higher level than the flow 19*b* in the illumination device passageway 27, resulting in rearward forces against the electronic display layer 13 to reduce or eliminate outward bowing. Such pressure differentials may be generated using features including, but not limited to, those shown and/or described in U.S. Pat. No. 10,398,066 issued Aug. 27, 2019, the disclosures of which are hereby incorporated by reference as if fully restated herein.

In exemplary embodiments, without limitation, one or more intake openings 53*a*, 53*b* into the illumination device passageway 27 from the rear passageway 21 may be larger than one or more exit openings 55*a*, 55*b* from the illumination device passageway 27 to the rear passageway 21. In this manner, more circulating gas may be ingested into the illumination device passageway 27 than is readily able to exit, thereby raising average pressure in the illumination device passageway 27.

As shown with particular regard to FIGS. 3A1-3A5, the electronic display layer 13 may be held in place by one or more brackets 51*a*, 51*b*. The brackets 51 may define, at least in part, the one or more intake openings 53*a*, 53*b* and/or the one or more exit openings 55*a*, 55*b*. At least some of the brackets 51 may comprise protrusions 57 configured to maintain relatively spacing for the intake openings 53 and/or the exit openings 55.

One or more of the closed loop fan units 20 may be provided wholly or partially within one or more housings 59. The housings 59 may be configured to direct circulating gas in an appropriate direction, such as between the front passageway 26 and/or the illumination device passageway 27 into the rear passageway 21, or vice versa.

One or more gaskets 61 may be provided at the housing 59. For example, without limitation, the gaskets 61 may be provided to fully or partially seal the housings 59 against a panel 63. In this fashion, the closed loop fan units 20 may be fully or partially sealed against the panel 63 so as to increase the amount of air forced into the front passageway 26 and/or the illumination device passageway 27, such as from the rear passageway 21, and/or out of the front passageway 26 and/or the illumination device passageway 27, such as from the rear passageway 21. The gaskets 61 may, alternatively or additionally, provide vibrational damping and/or sound reduction, such as during operation of the closed loop fan units 20. The gaskets 61 may comprise rubber and/or a rubber composite, by way of non-limiting example.

The panel 63 may form part of the open loop airflow pathway 23. For example, without limitation, the panel 63 and an additional panel 65 may be provided spaced apart from one another, such as with the corrugated layer 25 therebetween, to at least partially define the open loop airflow pathway 23.

In exemplary embodiments, positive pressure may be maintained in only the front passageway 26 and/or relatively high pressure may be maintained in the front passageway 26 (e.g., relative to pressure in the flow 19*b* in the illumination device passageway 27) such that the electronic display layer 13 is pushed towards the illumination device 15 when the closed loop fan unit 20 is operated. Optical spikes 29 or other support structures may be utilized within the illumination device passageway 27 to reduce or eliminate movement of the electronic display layer 13 towards the illumination device 15, such as past the optical spikes 29. The optical spikes 29 may comprise one or more optically transmissible materials. The optical spikes 29 may comprise rods, cones, or the like positioned within the illumination device cavity 27 and may be configured to limit or prevent rearward travel of the electronic display layer 13. The optical spikes 29 may exert normal, compressive forces on the electronic display layer 13, particularly in conjunction with the pressure of the flow 19*a* of the circulating gas within the front passageway 26. This may be particularly beneficial when unable to generate positive or sufficiently high pressure for the flow 19*b* of the circulating gas within the illumination device passageway 27. This may occur, for example, without limitation, due to variations in ambient air and/or circulating gas pressure. Circulating gas pressure, in particular, may vary due to temperature variations in the circulating gas (e.g., due to solar loading) and/or ambient temperatures, which may affect the unit's 10 ability to remove heat in air-to-air heat exchange.

In exemplary embodiments, the pressure of the circulating gas in the front passageway 26 and the illumination device passageway 27 may be regularly, sporadically, and/or continuously monitored and operations may be adjusted based on such measurements. Such operations may include the speed or other operation of the closed loop fans 20. Such operations may be adjusted to desired pressures in the front passageway 26 and the illumination device passageway 27, such as positive pressures in one or both, and/or desired differential pressure between the same.

Any number, type, kind, and/or arrangement of such optical spikes 29 may be utilized. In embodiments where more than one electronic display layer 13*a*, 13*b* is utilized, more than one set of optical spikes 29*a*, 29*b* for each respective one of the electronic display layers 13*a*, 13*b* of the same or different type may likewise be utilized, though such is not required. Such optical spikes 29 are not necessarily required, and may be omitted from view of certain embodiments provided herein to more clearly illustrate other components. However, such optical spikes 29 may be utilized in the same or similar arrangements in such embodiments, even if not expressly provided in the figures.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly comprising:

a cover layer;

an electronic display layer located behind the cover layer;

an illumination device located rearward of, and spaced apart from, the electronic display layer;

support structures extending from a forward surface of the illumination device towards a rear surface of the electronic display layer;

a closed loop airflow pathway including:

an illumination device passageway comprising a space between the forward surface of the illumination device and the rear surface of the electronic display laver, said support structures being thereby located in the illumination device passageway;

a front passageway comprising a space be tween a forward surface of the electronic display layer and a rear surface of the cover layer, wherein the cover layer is spaced apart from the electronic display laver; and a rear passageway located rearward of the illumination device and fluidly connected to an entrance and an exit of each of the illumination device passageway and the front passageway; and one or more closed loop fans located along the closed loop airflow pathway for moving circulating gas within the closed loop airflow pathway when activated.

2. The display assembly of claim 1, wherein:

the electronic display layer comprises liquid crystals;

the illumination device comprises a substrate and a plurality of light emitting diodes (LEDs) located thereon; and the support structures project longitudinally from the substrate.

3. The display assembly of claim 1, wherein:

the support structures comprise optical spikes, each comprising at least one optically transmissible material.

4. The display assembly of claim 3, wherein:

each of the optical spikes comprise a rod or cone.

5. The display assembly of claim 1, wherein:

a distal end of each of the support structures is normally spaced apart from the rear surface of the electronic display layer.

6. The display assembly of claim 5, wherein:

each of the support structures span at least 90% of a distance between the forward surface of the illumination device and the rear surface of the electronic display layer.

7. The display assembly of claim 1, wherein:

each of the support structures projects along a longitudinal axis thereof normal to the forward surface of the illumination device.

8. The display assembly of claim 1, wherein:

the one or more closed loop fans are located within the rear passageway.

9. The display assembly of claim 1, wherein:

the one or more closed loop fans are positioned adjacent to an entrance to the front passageway and the illumination device passageway such that, when activated, the one or more closed loop fans push said circulating gas into the front passageway and the illumination device passageway and pull said circulating gas through at least a portion of the rear passageway.

10. The display assembly of claim 9, wherein:

the one or more closed loop fans are configured to, when activated, generate positive, relatively high pressures within the front passageway and the illumination device passageway compared to the rear passageway.

11. The display assembly of claim 10, further comprising:

a panel located rearward of, and spaced apart from, a rear surface of the illumination device;

a fan housing for the one or more closed loop fans connected to the panel, wherein the one or more closed loop fans comprise a plurality of closed loop fans, each located within the fan housing; and a gasket extending between at least a portion of the fan housing and the panel.

12. The display assembly of claim 11, wherein:

each of the plurality of closed loop fans comprise centrifugal type fans.

13. The display assembly of claim 1, further comprising:

a panel located rearward of, and spaced apart from, a rear surface of the illumination device;

an open loop airflow pathway extending, at least in part, between the rear surface of the illumination device and a forward surface of the panel; and one or more open loop fans located along the open loop airflow pathway for moving ambient air within the open loop airflow pathway when activated.

14. The display assembly of claim 13, further comprising:

a corrugated layer extending between the panel and the illumination device.

15. The display assembly of claim 1, wherein:

the support structures are optically transmissible.

16. The display assembly of claim 15, wherein:

the support structures consist of optically transmissible materials.

17. A display assembly comprising:

a cover layer, which is transparent or translucent;

an electronic display layer located behind, and spaced apart from, the cover layer, said electronic display layer comprising liquid crystals;

a front passageway defined, at least in part, by a forward surface of the electronic display layer and a rear surface of the cover layer;

an illumination device located rearward of, and spaced apart from, the electronic display layer, said illumination device comprising a substrate and a plurality of light emitting diodes;

an illumination device passageway defined, at least in part, by a space between the forward surface of the substrate and a rear surface of the electronic display layer;

a rear passageway located rearward of the illumination device and fluidly connected to an entrance and an exit of each of the illumination device passageway and the front passageway;

a closed loop airflow pathway comprising the front passageway, the illumination device passageway, and the rear passageway; and a plurality of optical spikes, each being optically transmissible and arranged about, and extending normal from, a forward surface of the substrate of the illumination device, and including a rod or cone shaped portion projecting longitudinally towards a rear surface of the electronic display layer.

18. A display assembly comprising:

a cover layer;

an electronic display layer located behind, and spaced apart from, the cover layer, said electronic display layer comprising liquid crystals;

a front passageway defined, at least in part, by a forward surface of the electronic display layer and a rear surface of the cover layer;

an illumination device located rearward of, and spaced apart from, the electronic display layer, said illumination device comprising a substrate and a plurality of light emitting diodes;

an illumination device passageway defined, at least in part, by a space between the forward surface of the illumination device and the rear surface of the electronic display layer;

a rear passageway located rearward of the illumination device and fluidly connected to an entrance and an exit of each of the illumination device passageway and the front passageway;

a panel located rearward of, and spaced apart from, a rear surface of the illumination device;

a corrugated layer extending between the panel and the illumination;

an open loop airflow pathway defined, at least in part, by the rear surface of the illumination device and a forward surface of the panel;

a closed loop airflow pathway comprising the front passageway, the illumination device passageway, and the rear passageway;

closed loop fans located adjacent to the entrance to the illumination device passageway and the front passageway such that said closed loop fans, when activated, push said circulating gas into the front passageway and the illumination device passageway and pull said circulating gas through at least a portion of the rear passageway, said closed loop fans comprising centrifugal type fans;

open loop fans located along the open loop airflow pathway for moving ambient air within the open loop airflow pathway when activated, said open loop fans comprising centrifugal type fans; and a plurality of optical spikes, each being optically transmissible and arranged about, and extending normal from, a forward surface of the substrate of the illumination device, and including a rod or cone shaped portion projecting longitudinally towards a rear surface of the electronic display layer.

* * * * *